May 25, 1954 H. WARE 2,679,580

WIDE BAND RECEIVER-TRANSMITTER

Filed Jan. 24, 1945 2 Sheets-Sheet 1

INVENTOR.
HAROLD WARE

BY William D. Hall

ATTORNEY

May 25, 1954 H. WARE 2,679,580

WIDE BAND RECEIVER-TRANSMITTER

Filed Jan. 24, 1945 2 Sheets-Sheet 2

INVENTOR.
HAROLD WARE

BY William D. Hall
ATTORNEY

Patented May 25, 1954

2,679,580

UNITED STATES PATENT OFFICE 2,679,580

WIDE BAND RECEIVER-TRANSMITTER

Harold Ware, Dayton, Ohio, assignor to the United States of America as represented by the Secretary of War Application January 24, 1945, Serial No. 574,360

6 Claims. (Cl. 250—15)

(Granted under Title 35, U. S. Code (1952), sec. 266)

The invention described herein may be manufactured and used by or for the Government for governmental purposes, without the payment to me of any royalty thereon.

This invention relates to wide band receivers-transmitters.

An object of this invention is to provide means for tuning a receiver-transmitter over a wide band coverage, for instance, 147 to 240 mc.

Another object is to provide in a radio receiver-transmitter a simple circuit employing a wide band tuning arrangement so as to reduce size and weight and thus the required space for mounting this invention.

A further object is to provide wide band tuning means with a self-quenched superregenerative detector which in the past has been limited to narrow bands of tuning because of employment of conventional variable tuning condensers.

A still further object is to provide convenient means for mounting a tube directly on the tuning assembly so as to reduce the lengths of critical leads between the tube associated with the tuning coil and the tuning coil.

A further object is to provide means for shorting out the unused portion of the tuning coil so as to reduce the possibility of resonance by this unused portion of the tuning coil with other critical circuits.

A still further object is to eliminate the necessity for the employment of band-switching or plug-in coils to achieve the wide-width tuning of this invention with their resulting noise due to poor contacts.

A further object is to provide a receiver-transmitter unit in a self-contained receptacle and so arranged that the same antenna may be employed for both reception and transmission of signals by the use of a minimum of transmission lines.

Other objects and features of novelty will be apparent from the following description and the annexed drawings, it being clearly understood, however, that the invention is not limited in any way by such description and drawings, or otherwise than by the appended claims.

In one use for which the present invention was developed, the following problem arises:

A squadron of aircraft is dispatched over enemy territory. In the course of the necessary operations of the squadron, the aircraft comprising said squadron are scattered over a wide area. When operations are completed the squadron leader employs interrogator-respondor equipment which transmits a signal towards an approaching aircraft to be picked up and retransmitted by that aircraft to the interrogator-respondor of the squadron leader so that said squadron leader can determine the location and identity of the approaching aircraft. However, the enemy, in order to create confusion, sends out jamming signals which render the interrogator-respondor ineffectual. To offset this disadvantage the present invention was developed, providing a simple, light-weight, easily mountable circuit and employing an easily and conveniently adjustable wide band tuning arrangement. Thus, in the event of enemy jamming, the operator of this invention can quickly tune to another pre-determined frequency anywhere on the wide band covered by this invention.

In conventional means for tuning, a comparatively narrow band of frequencies is employed. Known means for employing wider frequency bands in radio receivers and transmitters require band-switching or plug-in coil arrangements. However, such arrangements necessitate the employment of bulky, heavy, bench-adjusted tuning equipment. Critical tuning while the equipment is in use is impossible under such arrangements. Lengths of critical leads cannot effectively be reduced and the distributed capacity between the leads causes the signal to leak off.

Due to the unique form of tuning employed in this transmitter-receiver the bands of frequencies are not limited to one revolution of a tuning dial because the variable tuning device employed is a variably tuned inductance coil and one rotation of the tuning shaft simply adjusts the tuning range over one convolution of the helix of the coil and there remain many more helices for additional tuning. Thus, in effect, there is produced a tuning arrangement having the advantages of a sliding contact over the helices of the coils with the added advantage of precision adjustment of the rotary movement of the tuning contact. The employment of this sliding contact also has the advantage of shorting out the unused portion of the tuning coil thereby eliminating resonance by the unused portion of the coil with other circuits.

Referring to the drawings in which similar reference numerals refer to like parts:

Figure 1:
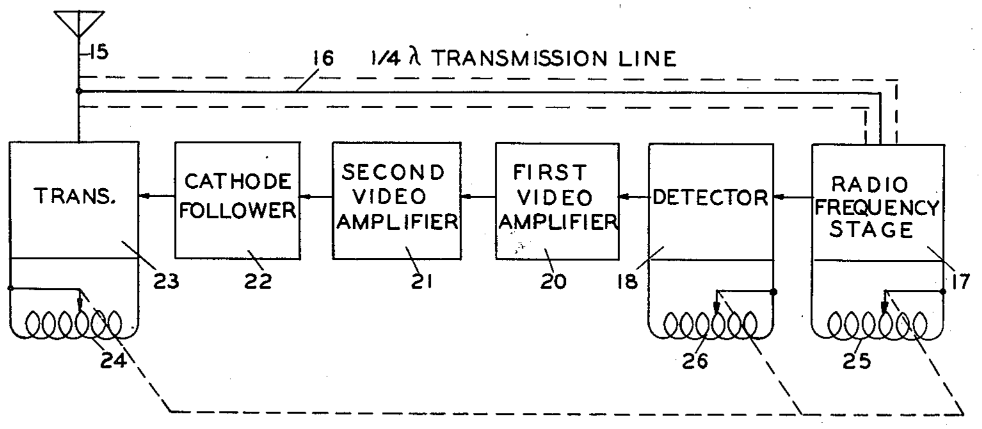
Figure 1 is a block diagram of one form of this invention designating the use of a common antenna by both transmitter and receiver components, and the stages of this invention utilizing the wide band tuning arrangement.

In the present embodiment, a pulse modulated radio frequency signal is transmitted on a predetermined frequency from the squadron leader's interrogator-respondor set. The signal is picked up by antenna 15 and inductively coupled through a quarter wave-length coaxial transmission line 16 to the control grid of the radio-frequency stage 17. Radio-frequency stage 17 is employed to block direct radiations of quench voltage from detector 18 so that this voltage cannot feed back to antenna 15 since at the high frequencies at which this invention operates, detector 18 acts as a transmitter the signals of which a sensitive enemy receiver could pick-up. The signal is then inductively coupled by coupling loop 19 to the grid of detector 18. Detector 18 is a self-quench type of detector. That is, the combination of resistor 29 and condenser 30 by virtue of their predetermined values set up a time constant by charge and discharge of condenser 30 through resistor 29, which determines the quench frequency. The value of grid leak condenser 30 causes the quench voltage to cut-off just at the point at which detector 18 would go into oscillation. At this point the detector 18 is most highly sensitive. In view of the fact that this type of detection has customarily utilized narrow frequency band type of tuning, the wide tuning range of tuning coil 26 is a radically novel type of tuning. The rectified output from detector 18 is resistance-capacitance coupled to the first video amplifier stage 20 of a 2-stage video amplifier. The amplified signal is then resistance-capacitance coupled to the second video amplifier stage 21 where it is further amplified. The output of video amplifier 21 is resistance-capacitance coupled to cathode follower stage 22. This stage provides a low impedance-matching tube to modulate transmitter 23. Transmitter 23 is directly coupled to the cathode of cathode follower 22. Transmitter 23 is normally biased to cut-off when there is no signal input, by dropping resistors 14 and 14′. When a positive video signal of sufficient amplitude is applied to the control grid of transmitter 23, the bias on transmitter 23 is overcome and oscillations are set up in tank coil 24. The current generated by these oscillations are inductively coupled by coupling loop 31 to antenna 15 for retransmission to receiver 27 of the squadron leader's interrogator-respondor 28. A head set may be plugged into the phone jack in the cathode circuit of transmitter 23 for monitoring said transmitter.

Figure 2:
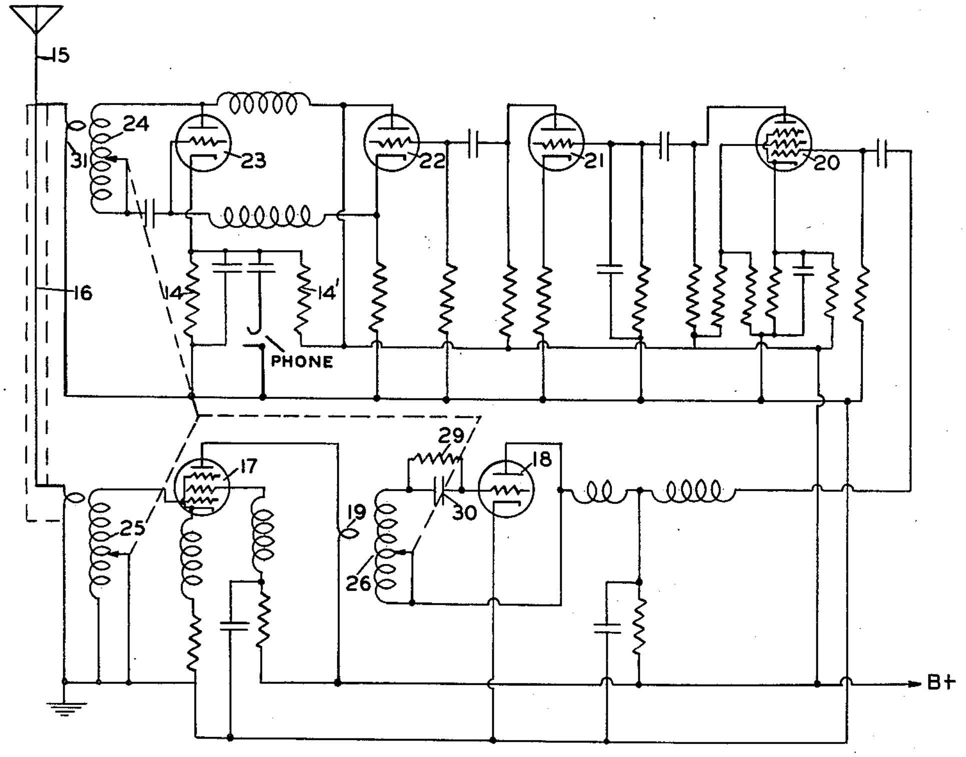
Figure 2 is a schematic diagram of one form of this invention.
Figure 3:
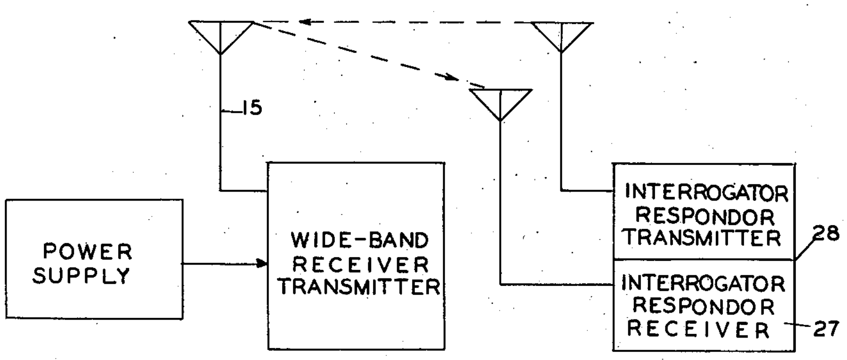
Figure 3 is a block diagram designating the manner in which power is supplied to the combined receiver-transmitter of this invention and its utilization of a common antenna to pick up and transmit signals.
Figures 4, 5:
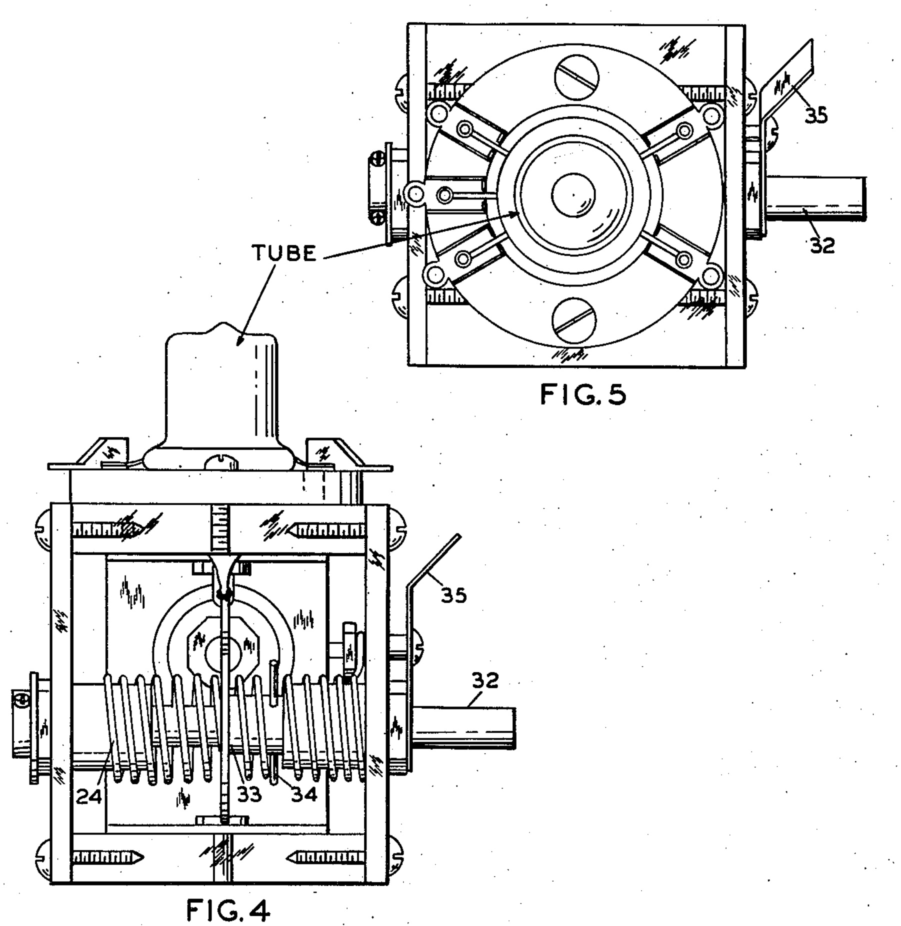
Figure 4 is a drawing of the tuning coil designating the manner in which the contact pin slides between the helices of the coil.
Figure 5 is a top plan drawing of the tuning coil assembly shown in Figure 4 designating the manner of mounting a tube directly over the tuning coil so as to reduce the lengths of critical leads.

In the present embodiment the wide band tuning coils 24, 25, 26 are utilized in the radio frequency, detector, and transmitter stages. The shaft 32 of these coils may be mechanically interconnected for simultaneously tuning the receiver-transmitter. This is shown Figs. 1 and 2 as a dotted line interconnecting the tuning arms of said coils. The number of turns of the tuning coil is determined by the lowest desired frequency.

That is, the size of the coil increases as the frequency decreases. For the frequency range of 147 to 240 megacycles, the number of turns of the tuning coil may be eight, of No. 12 gage, ⅝ inch diameter wire. Such a coil is distributed lengthwise in a space of 1½ inches. Running through the length of the coil may be a silver-plated brass shaft 32 with a brass sliding contact 33 which contains a metal pin 34 acting as a wiper contact between the coil and the shaft. Connection between the shaft and the associated circuit (radio frequency, detector or transmitter) is made by means of a Phosphor bronze 35 contact plate located near the end of the shaft and held in place by grooves in the shaft to make better electrical contact. At a given desired frequency, the pin will short out the unused portion of the coil.

Thus, the power supply from any adjoining equipment which will furnish 20 milliamperes at 400 volts D.-C. is utilized to power this invention so that when a signal is transmitted from the transmitter portion of the squadron leader's interrogator-respondor equipment, it is received by the antenna of this invention, detected, amplified, modulated, and automatically retransmitted, utilizing the same antenna, to the squadron leader's receiver portion of his interrogator-respondor equipment. The squadron leader is enabled to view the received signal on a cathode ray screen and determine that the approaching aircraft is a friend or foe, its distance, location, and other tactical information. Security from detection or jamming by the enemy is enhanced because of the ease with which the entire squadron may shift through a broad range of frequencies instantaneously simply by rotation of the tuning inductor shafts.

I claim:

1. A receiver-transmitter for pulse modulated radio frequency signals comprising an antenna, an inductively tuned radio frequency amplifier coupled to said antenna through a section of transmission line one-quarter wavelength long at the frequency of received radio frequency pulse signals for amplification of received radio frequency pulse signals, an inductively tuned super-regenerative detector connected to said radio frequency amplifier for detecting said pulse signals, pulse amplifier means connected to said detector for amplifying said detected pulse signals, an inductively tuned radio frequency oscillator-transmitter directly coupled to said antenna, said transmitter being normally biased to cut-off, and cathode follower means coupling the output of said amplifier means to said transmitter, whereby said detected and amplified pulse signals overcome the bias of said transmitter and cause said transmitter to transmit radio frequency oscillations for the duration of said pulse signals.

2. A receiver-transmitter as claimed in claim 1, wherein said radio frequency amplifier, detector, and oscillator-transmitter are each mounted upon its own variable inductance tuner.

3. A combined radio receiver and transmitter triggered by an interrogator-respondor comprising an antenna common to both receiver and transmitter, a radio frequency stage inductively coupled to said antenna for receiving radio frequency signal waves from said interrogator-respondor, detector and video amplifier stages coupled to the output of said radio frequency stage for detecting and amplifying said received signal waves, means for inductively tuning said radio-frequency and detector stages for operation over a broad band of frequencies, a radio frequency oscillator-transmitter stage normally biased to cut-off and inductively coupled to said common antenna, and an impedance-matching cathode follower stage coupling said oscillator-transmitter to said video amplifier output for impressing said detected and amplified signal waves on said oscillator-transmitter, thereby overcoming the bias on said oscillator-transmitter and causing said oscillator-transmitter to provide radio frequency oscillations.

4. A combined radio receiver and transmitter as set forth in claim 3, wherein said oscillator-transmitter includes means for inductively tuning said oscillator-transmitter over a broad band of frequencies.

5. A combined radio receiver and transmitter as set forth in claim 4, wherein the inductive tuning means for the radio frequency and detector stages comprise coils in helical form with a rotatable shaft within and spaced from each coil, said shafts being mechanically interconnected for simultaneous rotation, and contactor means electrically connected to each shaft and making contact along the helices of its coil as each shaft is rotated.

6. A combined pulse radio receiver-transmitter system employing a common antenna comprising a receiver having a radio frequency amplifier coupled to the antenna through a coaxial line one-quarter wavelength long at the frequency of received signals for receiving radio frequency pulses, detector and pulse amplifier stages coupled to the output of said amplifier for detecting and amplifying said pulses, and a transmitter comprising a normally inoperative radio-frequency oscillator directly coupled to the antenna and the receiver output, said oscillator being rendered operative by the detected and amplified pulse output of said receiver.

References Cited in the file of this patent

UNITED STATES PATENTS

| Number | Name | Date |
|---|---|---|
| 1,455,767 | Slepian | May 15, 1923 |
| 2,154,723 | Brown | Apr. 18, 1939 |
| 2,163,645 | Ware | June 27, 1939 |
| 2,202,699 | Leeds | May 28, 1940 |
| 2,247,212 | Trevor | June 24, 1941 |
| 2,320,428 | Hansell | June 1, 1943 |
| 2,415,359 | Loughlin | Feb. 4, 1947 |
| 2,419,571 | Labin et al. | Apr. 29, 1947 |
| 2,429,513 | Hansen et al. | Oct. 21, 1947 |
| 2,457,134 | Doelz | Dec. 28, 1948 |
| 2,460,202 | Tyson | Jan. 25, 1949 |